(12) United States Patent
Lupo et al.

(10) Patent No.: US 6,649,283 B1
(45) Date of Patent: Nov. 18, 2003

(54) POLYIMIDE LAYER COMPRISING FUNCTIONAL MATERIAL, DEVICE EMPLOYING THE SAME AND METHOD OF MANUFACTURING SAME DEVICE

(75) Inventors: Donald Lupo, Dublin (IE); Akio Yasuda, Stuttgart (DE); Martin Grell, Bethesda (GB); Dieter Neher, Dortmund (DE); Tzenka Miteva, Mainz (DE); Andreas Meisel, Frankfurt am Main (DE)

(73) Assignees: Sony International GmbH, Berlin (DE); Max-Planck-Gesellschaft zur Forderung der Wissenschaften e.V., Munich (DE)

( * ) Notice: Subject to any disclaimer, the term of this patent is extended or adjusted under 35 U.S.C. 154(b) by 0 days.

(21) Appl. No.: 09/622,125
(22) PCT Filed: Dec. 15, 1999
(86) PCT No.: PCT/EP99/09976
§ 371 (c)(1),
(2), (4) Date: Dec. 8, 2000
(87) PCT Pub. No.: WO00/36660
PCT Pub. Date: Jun. 22, 2000

(30) Foreign Application Priority Data

Dec. 15, 1998 (EP) ............................................. 98123834

(51) Int. Cl.⁷ ............................................... H05B 33/14
(52) U.S. Cl. ..................... 428/690; 428/1.1; 428/1.26; 428/473.5; 428/917; 313/502; 313/506; 313/509
(58) Field of Search ..................... 428/690, 917, 428/1.1, 1.26, 473.5; 313/502, 506, 509

(56) References Cited

U.S. PATENT DOCUMENTS

| | | | | |
|---|---|---|---|---|
| 5,443,921 A | * | 8/1995 | Hosokawa et al. | 428/690 |
| 5,536,588 A | | 7/1996 | Naito | 428/690 |
| 5,554,450 A | * | 9/1996 | Shi et al. | 428/690 |
| 5,705,284 A | * | 1/1998 | Hosokawa et al. | 428/690 |
| 5,821,003 A | * | 10/1998 | Uemura et al. | 428/690 |
| 5,985,417 A | * | 11/1999 | Shi et al. | 428/195 |
| 6,040,069 A | * | 3/2000 | Lupo et al. | 428/690 |
| 6,150,042 A | * | 11/2000 | Tamano | 428/690 |
| 6,361,886 B2 | * | 3/2002 | Shi et al. | 428/690 |

FOREIGN PATENT DOCUMENTS

| | | | |
|---|---|---|---|
| EP | 0 702 075 A1 | | 3/1996 |
| JP | 10-302960 | * | 11/1998 |
| WO | WO 98/21758 | * | 5/1998 |
| WO | WO 98/42655 | * | 10/1998 |

OTHER PUBLICATIONS

Lussem et al., "Polarized Electroluminescence of light emitting liquid in crystalline polymers", Liquid Crystals, vol. 6, No. 21, pp. 903–907, 1996 (XP–002077041).
Wu et al., "Fabrication of Polymeric Light Emitting Diodes Based on Poly(p–phenylene vinylene) LB Films", Chemistry Letters, pp. 2319–2322, 1994 (XP–002103242).
Nakaya et al., "Electrooptic Bistability of Ferroelectric Liquid Crystal Device Prepared Using Charge–Transfer Complex–Doped Polyimide–Orientation Films", Japanese Journal of Applied Physics, vol. 28, No. 1, pp. L116–L118, Jan. 1, 1989 (XP–002103243).
Salbeck, "Electroluminescence with Organic Compounds", Berichte Der Bunsengesellschaft Fur Physikalische Chemie, vol. 100, No. 10, pp. 1667–1677, Oct. 1996, (XP–0012103244).

* cited by examiner

Primary Examiner—Cynthia H. Kelly
Assistant Examiner—Dawn Garrett
(74) Attorney, Agent, or Firm—Frommer Lawrence & Haug LLP; William S. Frommer; Samuel H. Megerditchia

(57) ABSTRACT

The invention relates to novel layers comprising polyimide and organic functional material such as hole transport material, electron transport material and/or emitter material having a glass transition temperature of higher than 80° C. The layers can be prepared by mixing the functional material with a polyimide precursor material, forming a thin film out of the mixture and converting said mixture into doped polyimide. Said doped polyimide layers can be used for the manufacture of electronic and optoelectronic devices such as e.g. light emitting devices. Due to the content of functional material, they can act as hole transport, electron transport or emitter layer. Moreover, the layers can be processed to have aligning properties for liquid crystals, thus allowing the manufacture of devices emitting polarized light. Furthermore, after conversion to doped polyimide, the layers are resistant to solvent treatment allowing the preparation of multi-layers by successive coating and conversion cycles.

19 Claims, 7 Drawing Sheets

POLYIMIDE LAYER COMPRISING FUNCTIONAL MATERIAL, DEVICE EMPLOYING THE SAME AND METHOD OF MANUFACTURING SAME DEVICE

FIELD OF THE INVENTION

The invention relates to layers comprising polyimide and a functional material such as a hole transport material (hole conductor material), an electron transport material (electron conductor material) or an emitter material. Polyimide layers doped with said functional materials can be used for the production of novel electronic and optoelectronic devices.

BACKGROUND OF THE INVENTION

The use of polyimide layers as polyimide alignment layers to orient liquid crystalline materials is a standard technology in the liquid crystal (LC) display industry. A review of the state of the art in orienting layers for liquid crystals can be found in Ref. [1].

Polyimides for alignment layers are typically prepared from polyamic acid or polyamic ester precursor compounds. One example of a precursor polyimide is ZLI 2650 from Merck. Usually, the precursor polymer is first deposited and subsequently chemically or thermally converted into an insoluble polyimide. Alternatively, soluble preconverted polyimides can be used.

The orientation layer is prepared in order to give it aligning properties. Conventionally, surface preparation is made by rubbing with a cloth. Other methods for surface preparation known in the art make use of polarized ultraviolet light or flows of hot air. The liquid crystals are subsequently aligned by depositing them onto the alignment layer and letting them align at a temperature above the melting point and below the clearing point of the materials.

However, polyimide films are very poor hole or electron conductors. Thus, if layers are required which have a high hole or electron transport and injection ability, as in the case discussed in the following paragraph, undoped polyimide films would reduce the efficiency of the respective devices.

On the other hand, light-emitting devices (LEDs) based on organic and polymeric electroluminescent materials are known. Typically such devices require two electrodes of differing work function, at least one of which is transparent. A high work function anode (e.g. indium tin oxide (ITO), fluorine-doped tin oxide (FTO), or gold) serves for hole injection and a low work function cathode (e.g. Mg, Al, Li, Ba, Yb, Ca) for electron injection into the organic or polymeric material.

In order to make a high efficiency LED, it is desirable for current in the device to be space charge limited instead of injection limited. As will be described in detail below, a space charge limited current is indicated in J*d versus V/d plots by the independence of the plot from the interelectrode distance d.

For realizing space charge limited current, the barriers for charge injection have to be small. One way to achieve this is to fabricate devices comprising additional layers to facilitate injection and transport of electrons and holes. One type of layer comprises organic hole conductors, typically aromatic amines, which facilitate the injection and transport of holes in the device.

These materials are typically used in the undoped state and represent organic semiconductors with a low intrinsic conductivity. Such semiconducting hole conductor layers can increase the efficiency of the device by balancing injection and charge of positive and negative charge carriers and forcing the recombination of charge carriers to occur in a region well away from the electrodes, thereby preventing the emission efficiency from being reduced by semiconductor/metal interactions. The use of hole conducting layers in polymeric and organic LEDs is described e.g. in Refs. [2] and [3].

In most cases the multilayers are prepared by organic evaporation to avoid dissolving the previously applied layer, which can happen when solvent-based processing such as spin coating, doctor blading, dip coating, etc. are used.

Alternatively, metallically conductive doped conjugated polymers such as polythiophene or polyaniline may be used as anode modification layers to adjust the work function of the electrode and to provide a stable interface between semiconductor layer and anode. The use of such electrodes is described in Refs. [4] and [5].

The use of dendrimeric structures (Ref. [6]), sterically hindered structures using spirobifluorene or triptycene units (Refs. [3] and [7]) and crosslinkable structures (Ref. [8]) having a relatively high glass transition temperature (glass temperature, $T_g$) and forming a stable glassy phase, in organic LEDs has been described. The glass transition temperature is phenomenologically characterized by the transition from a more or less hard, amorphous glass-like or partially crystalline state into a rubber-like to viscous melt-like state.

In recent years, the possibility of realizing polymeric LEDs emitting polarized light has been investigated. Thereby, polarized emission has been achieved to some extent by stretch orienting emitting, non liquid crystalline polymers (Ref. [9]). Also in this reference, the possible use of polarized polymer LEDs as backlights for liquid crystalline displays is addressed. In Ref. [10], polarized emission from rigid-rod molecules which were aligned by the Langmuir-Blodgett transfer method is described. In both cases, no orientation in a liquid crystalline phase was used to achieve polarized alignment.

A polymer LED in which a layer of polythiophene or polyaniline was rubbed and used to align a low molecular weight liquid crystal doped with a small amount of dichroic fluorescent dye is described in Ref. [11]. However, the aligning ability of polythiophenes is known to be not high and, indeed, alignment of polymeric liquid crystals on rubbed polythiophene was not shown.

Polarized emission was obtained on rubbed poly(p-phenylenevinylene) according to Ref. [12]. LEDs comprising polymeric liquid crystalline emitter materials aligned on rubbed polyimide are disclosed in Ref. [13]. However, polyimide cannot serve as a hole or electron conducting material. In Ref. [14], polarized electroluminescence by epitaxial growth of sexiphenylene onto a rubbed sexiphenylene film is described.

The use of a polyimide derivative in a photoconductive device is described in Ref. [15]. The polyimide derivative is a polyimide comprising, covalently linked, a moiety in the main chain that might serve as a hole conducting compound.

Finally, a hole conducting layer prepared by mixing the hole conductor N,N'-diphenyl-N,N'-di(m-tolyl)benzidine (TPD) with a polyamic acid precursor in the ratio 50/50 by weight, followed by thermal conversion, is described in Ref. [16]. TPD has a glass transition temperature ($T_g$) of 65° C. and a molecular weight of below 500.

As described in Ref. [16], a two-layer LED can be made with the above TPD/polyimide layer by vacuum deposition of an aluminum complex as electron transport and emitting material. However, at concentrations high enough to produce good hole transport, the hole conductor TPD and the polyimide phase separate and the TPD crystallizes. This brings about the problem, firstly, that the phase separated TPD is susceptible to attack by solvents in subsequent coating processes and, secondly, that the film cannot be processed to be an orientation layer, especially by rubbing, as rubbing of the layer comprising crystallized TPD would result in severe damage.

As mentioned above in the context of characteristics of polyimide films, polyimide itself has only poor hole or electron transport and injection properties. Thus, the use of a polyimide layer in an undoped state reduces the efficiency of devices in which hole/electron transport is needed.

On the other hand, although some alignment can be achieved by rubbing electrically conducting or hole transporting polymers, these materials do not have such a high degree of aligning ability as polyimide. Thus, alignment layers based on such polymers are unsatisfactory.

In addition, one is restricted to the energy levels and hole mobilities provided intrinsically by the materials, although in principle one wishes to be able to adjust the energy levels and mobilities independently of each other, as well as the aligning ability of the material.

Thus, by dividing the energy barrier for hole injection into several small barriers by stepwise deposition of materials with different energy levels, an improvement of hole injection efficiency should be possible. However, currently this cannot be done with solvent processed films because of cosolubility. In other words, application of an additional layer onto a previously applied layer by a method employing a solution of the material to be applied in a solvent would result in a dissolution of said previously applied layer.

Therefore, in the production of multilayer electroluminescent devices showing high efficiency and whose color can be tuned by choosing different chromophores, one is limited to low molecular weight materials which are deposited by organic physical vapour deposition under high vacuum. Consequently, only a few of such systems, which are not easily changed, are available. However, it would be desirable to replace said low molecular weight materials with robust, flexible polymers as well as to replace vacuum deposition with low-cost solvent based coating technologies. As described above, this is not possible with commenly used solvent based methods according to the state of the art because the first layer is dissolved by the solvent used for depositing subsequent layers.

OBJECTS AND SUMMARY OF THE INVENTION

Thus, in view of the above, it is an object of the invention to provide a novel layer for use in electronic and optoelectronic devices that provides good aligning ability as well as good hole or electron transport or emitter ability, whose aligning and conductor ability can be easily and independently tuned, and which can be processed for alignment with standard techniques, such as rubbing. Furthermore, the layer should be resistant to standard organic solvents, such as toluene, THF, methylene dichloride etc., thus allowing stepwise deposition of additional layers thereon by methods other than vacuum deposition techniques.

Furthermore, it is an object of the invention to provide electronic and optoelectronic devices making use of the above layers, and a method of producing them.

According to the invention, there is provided a layer comprising polyimide and one or more organic materials selected from the group consisting of hole transport materials, electron transport materials and emitter materials, wherein the hole transport, electron tranport or emitter material has a $T_g$ of higher than 80° C.

Said layer is obtainable by mixing a hole transport, electron transport or emitter material or a combination thereof with a polyimide precursor material, forming a thin film out of the mixture and converting said mixture into a thin film of doped polyimide.

Preferably, the hole transport, electron transport or emitter material used in the layer according to the invention has a molecular weight of greater than 750 and, more preferably, a $T_g$ of higher than 100° C. and/or a molecular weight of greater than 900.

Furthermore, the content of hole transport, electron transport or emitter material (i.e. the doping material) in the mixture of doping material and polyimide precursor material used to prepare said layer is preferably selected in the range of 1% to 60% by weight, more preferably in the range of 5% to 50% by weight, and most preferably in the range of 15% to 35% by weight, based on the total amount of doping material and polyimide precursor material.

The layers according to the invention are, after conversion to polyimide, thermally stable up to well over 100° C. without morphological or chemical changes. They are homogenous, do not phase separate and can be easily processed to have aligning properties by standard techniques such as rubbing, UV irradiation, treatment with an air flow, etc.

The layers combine the qualities of good alignment materials on the one hand and of good hole transport, electron transport or emitter materials, respectively, on the other hand.

By varying the concentration of e.g. the hole transport material in the mixture with polyimide, the mobility can be tuned to the optimal value for the device in question. By doping with different hole conductors the energy levels can be tuned for optimal hole injection.

It has been found that by using the films according to the invention, it is possible to obtain space charge limited current over a wide range of concentrations and mobilities.

In addition, the homogeneously mixed composite layers according to the invention are resistant after conversion to polyimide to further solvent treatment, thereby allowing the preparation of multilayers by successive coating and conversion cycles. This allows on the one hand the preparation of successive hole injection and conducting layers with small energy barriers to improve hole injection. It also allows on the other hand the preparation of e.g. multilayer electroluminescent devices with tunable mobilities and energy levels by solvent based coating processes.

Thus, the layers according to the invention combine all of the above advantages of stability, charge injection and transport, tunability and solvent resistance with a high aligning ability.

Furthermore, there are provided according to the invention electronic and optoelectronic devices according to claims 10, 12 and 16 and a method of manufacturing said devices according to claim 17, the method and devices making use of the above layers of the invention.

BRIEF DESCRIPTION OF THE INVENTION

In the following, the invention will be described in further detail by way of embodiments and examples and with reference to the accompanying drawings, wherein.

DETAILED DESCRIPTION OF THE INVENTION

Figure 1:
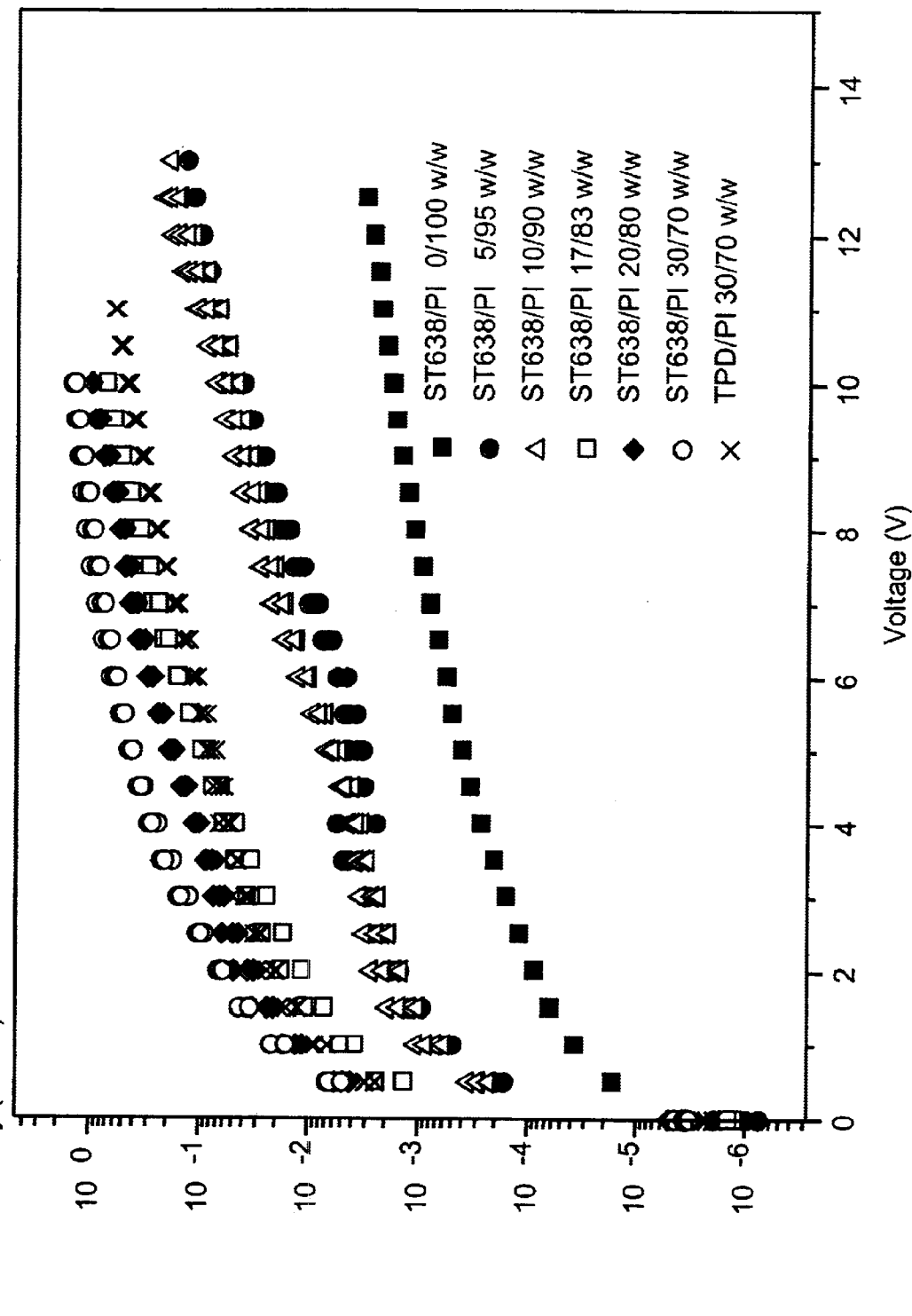
FIG. 1 is a diagram showing the dependence of the measured current density on the hole transport material/polyimide ratio in hole transport layers prepared according to Example 1.

The layer according to the invention comprises a polyimide, obtainable by thermal conversion of polyimide precursor material, and a doping material. An example of a polyimide precursor material is a polyamic ester precursor for polyimide such as ZLI 2650, available from Merck, Darmstadt. Further examples are those disclosed in Japanese laid-open patent application Nos. 53-24850, 57-29030, 53-128350, 61-47932, 62-174725 and 61-205924.

The doping material used in the present invention can be a hole transport material, an electron transport material or an emitter material and has a $T_g$ of higher than 80° C. Examples of hole transport materials include compounds or mixtures of compounds selected from the group consisting of compounds of the general formula (I)

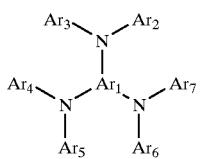

(I)

where $Ar_1$ is selected from the group consisting of the following compounds (1) to (5)

(1)

(2)

(3)

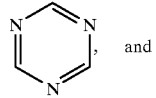

, and (4)

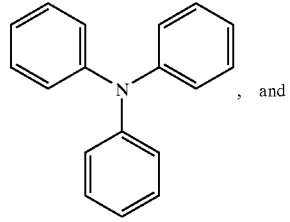

, and (5)

where $Ar_2$ to $Ar_7$ are independently of each other selected from the group consisting of the following compounds (a) to (e)

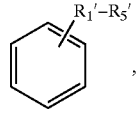

(a)

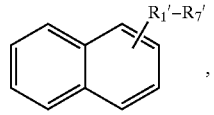

(b)

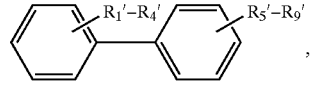

(c)

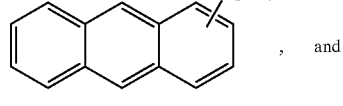

, and (d)

$$Ar_1—N\begin{matrix}Ar_2\\ \\Ar_3\end{matrix}$$

(e)

wherein $R_1'$ to $R_9'$ independently of each other denote a hydrogen atom, a $—C_nH_{2n+1}$ residue, a $—OC_nH_{2n+1}$ residue, with n being an integer, preferably an integer in the range of 1 to 20, more preferably in the range of 1 to 10, or a group of the general formula

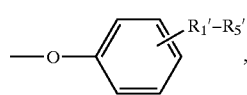

compounds of the general formula (II) (spiro compounds)

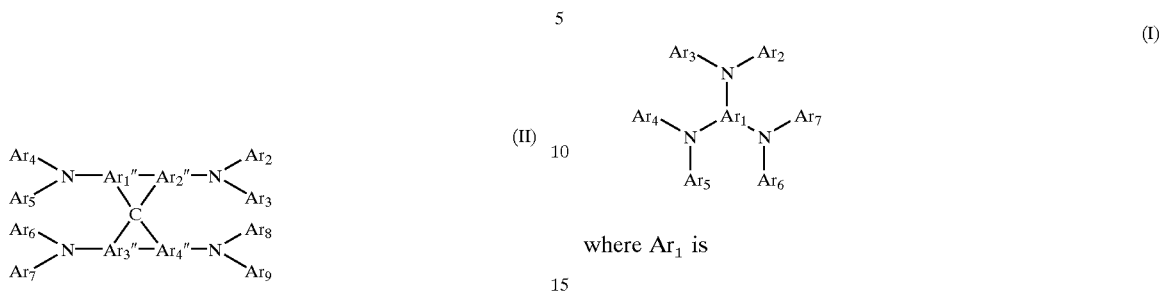

where $Ar_1''$ to $Ar_4''$ independently of each other denote compounds selected from the group of compounds (1) to (5) as specified above and where $Ar_2$ to $Ar_9$ independently of each other denote compounds selected from the group of compounds (a) to (e) as specified above, and compounds of the general formula (III) (triptycenes)

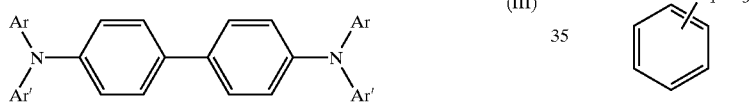

where Ar is a compound having the structure

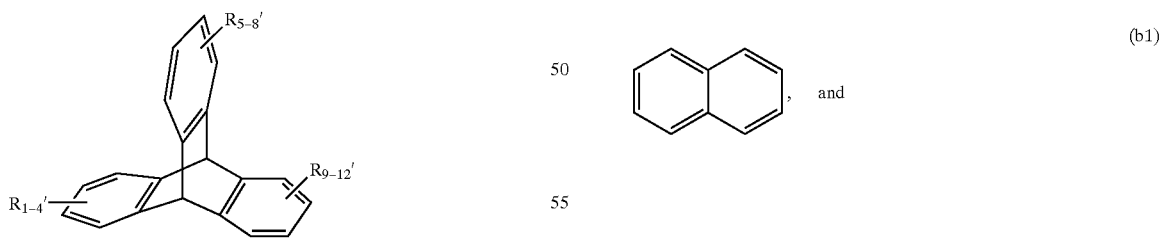

with $R_1'$ to $R_{12}'$ independently of each other representing a group as specified above for $R_1'$ to $R_9'$ and where Ar' represents the same group as Ar or denotes a compound selected from the group of compounds (a) to (e) as specified above.

Preferred examples of hole transport materials are compounds of the general formula where $Ar_1$ is

(1) and where $Ar_2$ to $Ar_7$ are independently selected from the group consisting of the compounds (a) with $R_1'$ to $R_5'$ independently of each other denoting a hydrogen atom, a —$C_nH_{2n+1}$ residue or a —$OC_nH_{2n+1}$ residue with $1<n<6$.

(b1)

and (c1)

Other preferred hole conductor compounds of this class are 4,4',4"-tris((1-naphtyl)-N-phenylamino)-triphenylamine (available from Syntec GmbH under the trade name ST638) having the following structural formula (IV)

(IV)

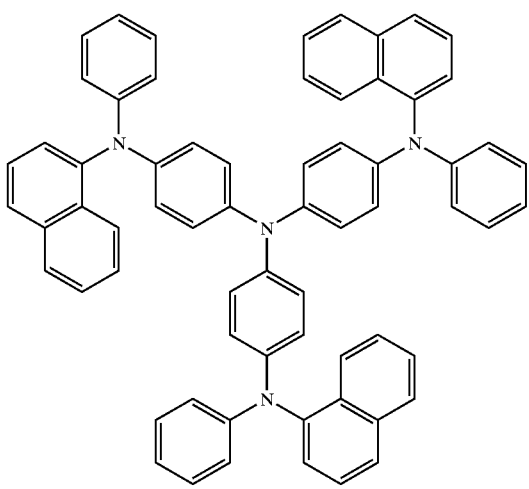

and 4,4',4''-tris((3-methylphenyl)-N-phenylamino)-triphenylamine (available from Syntec GmbH under the trade name ST627) having the following structural formula (V)

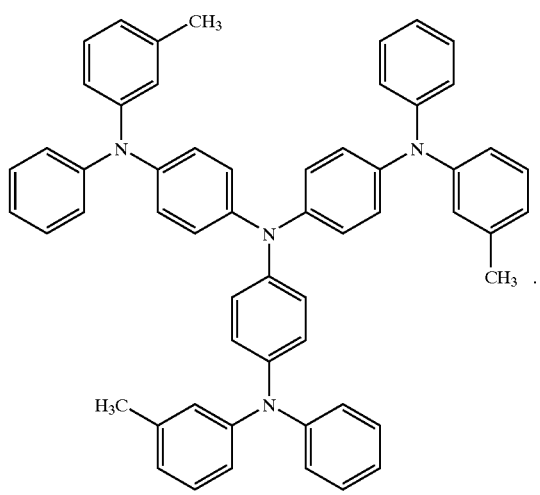

Further preferred examples of hole transport materials are compounds of the general formula (II)

(II)

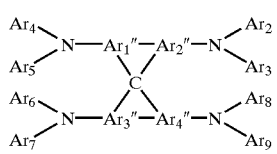

where $Ar_1''$ to $Ar_4''$ denote

(1) and where $Ar_2$ to $Ar_9$ independently denote compounds selected from the group of compounds (a) to (e) as specified above.

Examples of electron transport materials include oxadiazoles as disclosed in Ref. [3], such as spiro-2-(biphenyl-4-yl)-5-(tert-butylphenyl)-1,3,4-oxadiazole having the structural formula (VI)

(VI)

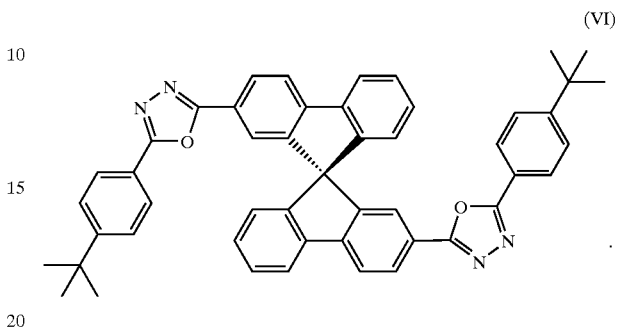

Examples of emitter materials include spirophenylenes as disclosed in Ref. [3], such as spiro-linked quater-, sexi-, octi- and deciphenyls, the spiro-sexiphenylene being shown in structural formula (VII)

(VII)

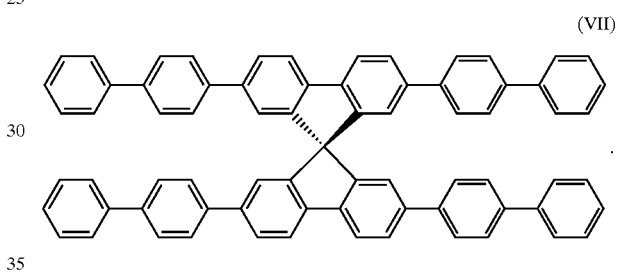

Although the exact structure of the doped polyimide layer is not known, it is assumed that the hole transport, electron transport and emitter materials selected to perform the invention do not take part in the polymerization reaction of the polyimide precursor material so that they are not covalently linked to the polyimide molecules. In other words, the doping material-polyimide layer according to the invention is a guest-host system.

In one embodiment of the invention an electronic or optoelectronic device, e.g. a rectifying diode, a transistor, a photodiode, a photovoltaic cell or a light emitting device comprising at least one polyimide layer according to the invention doped with electron or hole transport or emitter material is fabricated.

In a preferred embodiment of the invention an electronic or optoelectronic device, preferably an electroluminescent light emitting device is fabricated, comprising a hole transport layer according to the invention.

In another embodiment of the invention the doped polyimide layer is subsequently prepared to give it aligning properties for liquid crystals. This preparation can be made by a number of methods known in the art, including rubbing, UV irradiation and treatment with air flow. Subsequently a liquid crystalline material or a composite comprising a liquid crystalline material is applied to the layer and aligned, according to the state of the art, at a temperature between the melting and clearing points of the liquid crystalline material.

In a preferred embodiment of the invention the liquid crystalline material comprises a polymeric liquid crystalline material, e.g. a polyfluorene.

In another preferred embodiment of the invention the liquid crystalline material comprises a light emitting material.

In a particularly preferred embodiment of the invention the polymeric liquid crystalline layer comprises a light emitting material.

Light emitting materials for use in LEDs are known in the art (e.g. Ref. [11]). An example of an emitter compound is shown in formula (VIII).

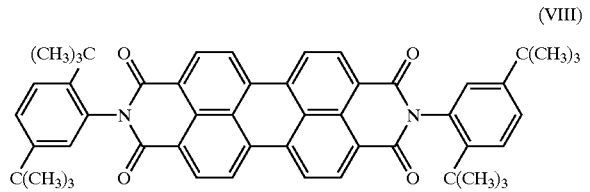

(VIII)

An example of a low molecular weight liquid crystal material, also disclosed in Ref. ([11] is shown in formula (IX).

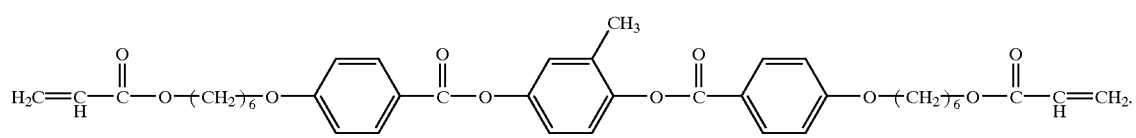

(IX)

In an especially preferred embodiment of the invention a light emitting electroluminescent device is provided comprising a hole transport layer according to the invention prepared as an alignment layer and a polymeric liquid crystalline material comprising a light emitting material. Through the orientation of the liquid crystalline material the light emitted by the device is polarized.

In a very especially preferred embodiment of the invention the polymeric liquid crystalline material itself is an emitter material, preferably a polyfluorene.

In a very particular embodiment of the invention an electroluminescent device is prepared in the following way: A hole transport material doped polyimide precursor layer, preferably comprising ZLI 2650, is deposited onto a transparent conductive glass substrate (e.g. ITO or FTO glass) and converted thermally to polyimide. This layer is subsequently rubbed or irradiated to prepare it as an orientation layer. A liquid crystalline polymeric emitter material, preferably a polyfluorene, is spin-coated onto the hole conductor alignment layer and aligned at a temperature between the melting and clearing points of the liquid crystal polymer. Subsequently a cathode comprising a metal such as Al, Ca, Li, Ba, Mg or Ag is deposited on top to produce a device capable of emitting polarized light upon application of an electric field.

EXAMPLES

The following examples are intended to illustrate possible embodiments of the invention but not to limit the scope thereof.

Example 1

Device Comprising Novel Hole Transporting Layers and Demonstrating Space Charge Limited Current Indium Tin Oxide coated glass, commercially obtained from Balzers Thin Films, was cut into 2.5×2.5 cm² pieces and cleaned in following steps:

ultrasonic bath of acetone—15 min ultrasonic bath of 2 vol. % water solution of "Helmanex"—5 min washing with deionized water ultrasonic bath of ultrapure water (Millig unit from Waters)—15 min drying in air ultrasonic bath of isopropanol—15 min Solution blends of a hole conductor and a polyamic ester precursor for polyimide were prepared with an overall solid concentration of 30 g/l. The hole transporting filling material was the starburst amine compound 4,4',4"-tris(1-naphtyl)-N-phenylamino)-triphenylamine, commercially available from Syntec GmbH under the tradename ST638. The chemical structure of this hole transport material is shown in above structural formula (IV). The polyamic ester precursor for polyimide was LiquicoatPI Kit ZLI-2650 from Merck. The structure of the converted polyimide (in the folowing: PI) is shown in structural formula (X) below.

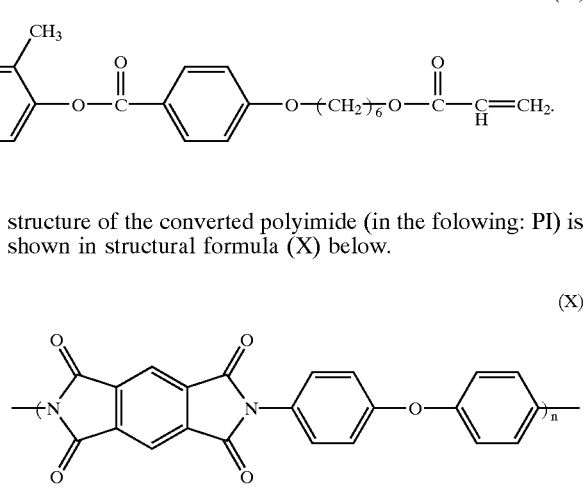

(X)

The weight ratios of ST638 to the polyimide precursor were 5/95, 10/90, 16.6/83.4, 20/80 and 30/70 w/w.

The blended solutions were spin-coated onto ITO/glass substrates at 750, 1500, 2200 and 3000 rpm for 50 s. The ST638-dispersed PI precursor thin films were soft-baked at 80° C. for 15 min and subsequently thermally imidized into insoluble PI at 300° C. for 1 h and 15 min under vacuum (about $10^{-2}$ mbar). The films were homogenous before and after imidization, with no evidence for phase separation or crystallization of the hole conductor.

After that the Al cathode contacts (thickness 70 nm) were deposited by thermal evaporation onto the converted films. The evaporation process was performed at 0.5 nm/s in a vacuum of about $10^{-6}$ mbar (1 bar=$10_5$ Pa). The final area of the devices was about 0.06 cm².

The current density—voltage (J-V) characteristics of the devices with different concentrations of ST638 dispersed PI films are shown in FIG. 1. A strong dependence of the measured current density on the hole conductor concentration was observed. The absolute currents values for the ratio ST638/PI 30/70 w/w are comparable with those passing through devices consisting of single layer of pure starburst amine compound 4,4',4"-tris(3-methylphenyl)-N-phenylamino)-triphenylamine.

Figure 2:
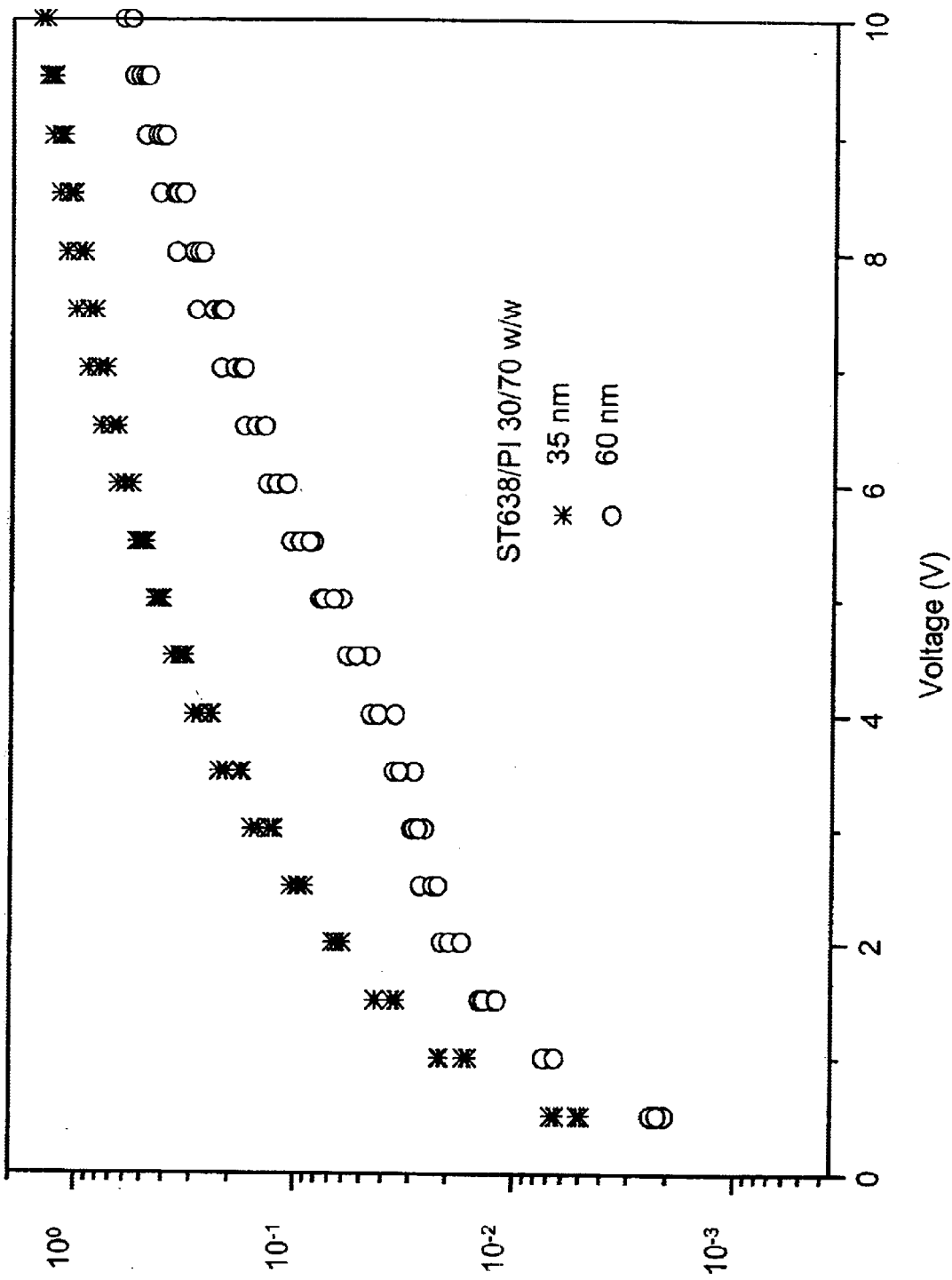
FIG. 2 is a diagram in which current densities versus applied voltage for the devices with the smallest and the biggest film thickness investigated in Example 1 are shown.
Figure 3:
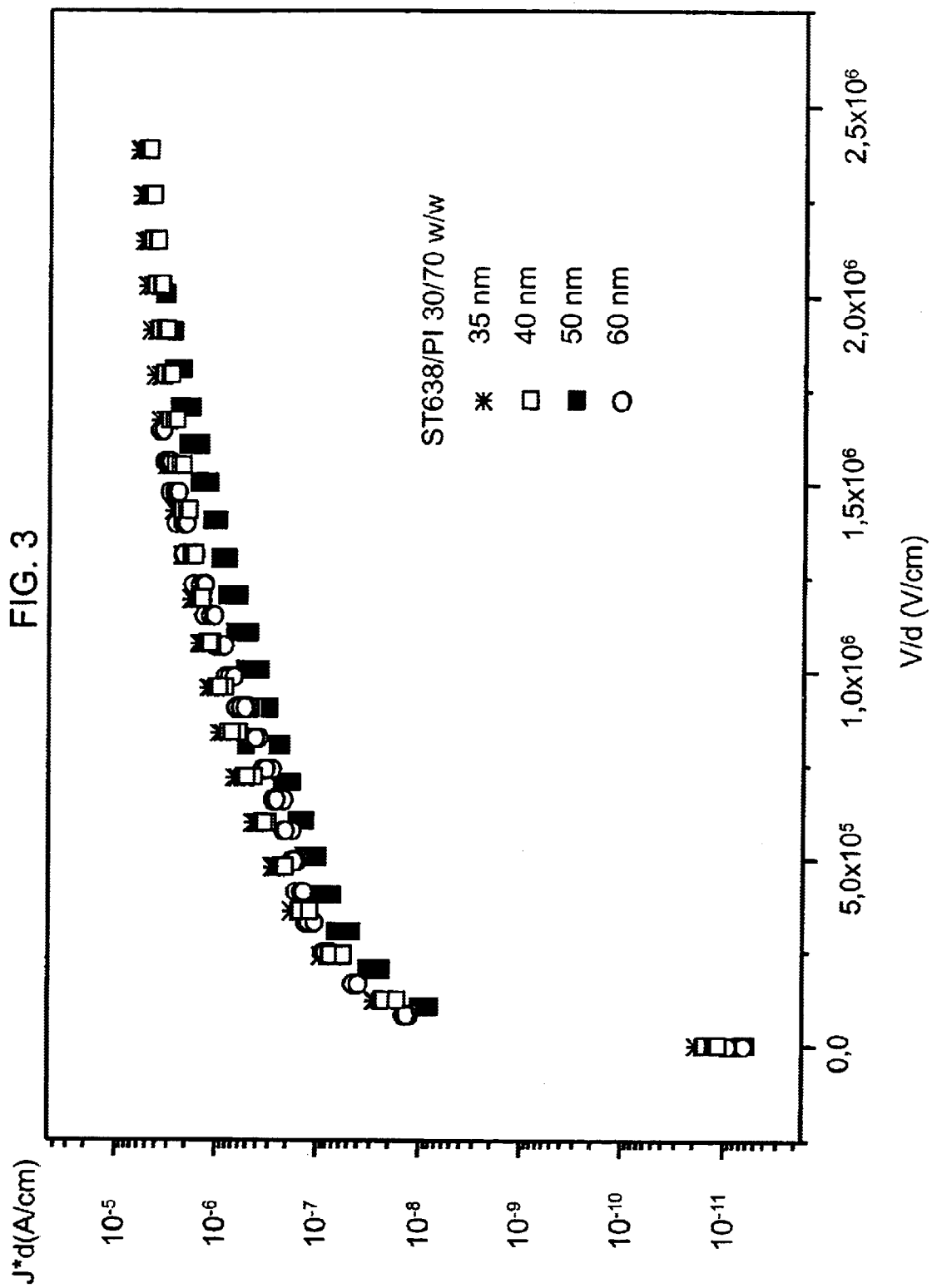
FIG. 3 is a diagram in which current density times film thickness (J*d) versus applied electric field strength (V/d) for the device based on the film with a ST638/polyimide ratio of 30/70 (w/w) according to Example 1 is shown.

Strong dependence of J was also observed on the film thickness (FIG. 2). Space-charge-limited current theory predicts the J to be $$J=9/8 \ (ee_o m V^2/d^3)$$

where $e_o$ is the permittivity of the vacuum, e is the permittivity of the polymer, m is the charge mobility, d is the interelectrode distance and V is the applied external voltage. Therefore, the plot J*d versus the electric field strength E=V/d should be independent on the device thickness. This plot is shown in FIG. 3. Having in mind the errors in thickness measurements the plot becomes virtually independent on the film thickness, which is an indication that this regime is dominated by space-charge-limited currents.

Example 2

Device Comprising a Standard Hole Conducting Material (Comparative Example)

A device was prepared according to the same procedures as Example 1, but instead of a high $T_g$ hole transport material, N,N'-diphenyl-N,N'-di(m-tolyl)benzidine (TPD) having a $T_g$ of 65° C. (obtained from Aldrich) was used at a concentration of 30% by weight. After imidization phase separation between the polyimide and the TPD and partial crystallization of the TPD could be observed.

The J-V curve of this device is included in FIG. 1 of the previous example. Even at a high concentration of 30% by weight, the maximum measured current density in this device is smaller than the density in the device containing a layer according to the invention with only 17% hole conductor.

Example 3

Light Emitting Diode Comprising Novel Hole Transporting Layer and Polyfluorene as the Emissive Material The device consisted of an ITO coated glass, a hole transporting layer having a weight ratio of ST638 to the PI precursor of 17/83, an emissive layer of poly[2,7-(9,9-diethylhexylfluorene)] and a calcium top electrode protected with a layer of aluminum.

An ITO coated glass was cleaned as described in Example 1. Upon this glass a hole transporting layer as described in Example 1 with a concentration of 17 weight % of hole conductor was applied by spin coating as described in Example 1. Thickness of the layer after conversion to polyimide was 50 nm.

Poly(2,7-(9,9-di(ethylhexyl)fluorene)) was prepared according to the following procedure:

Synthesis of the monomer 2,7-dibromo-9,9-di(ethylhexyl) fluorene

Reaction scheme

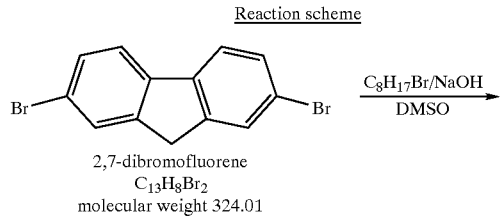

2,7-dibromofluorene
$C_{13}H_8Br_2$
molecular weight 324.01

-continued

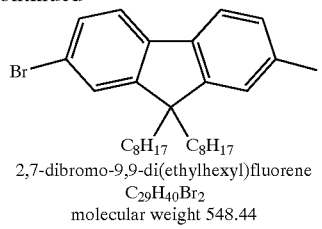

2,7-dibromo-9,9-di(ethylhexyl)fluorene
$C_{29}H_{40}Br_2$
molecular weight 548.44

Procedure

Into a Schlenk tube was placed 5 g of 2,7-dibromofluorene (15.4 mmol, 1 equ.), 15 ml of dimethylsulfoxide ($DMSO_2$) and 0.27 g of benzyltriethylammonium chloride (1.18 mmol). Under a light stream of argon 6.7 ml of an aqueous sodium hydroxide solution (50%, wt.) were added and the mixture was stirred for 5 minutes. N-(ethylhexyl)bromide (8.8 ml, 36.9 mmol, 2.4 equ.) was added dropwise using a syringe and the highly viscous mixture was stirred for 2 hours under argon. A significant raise in temperature could be noticed in course of the first 30 min reaction time.

Water (25 ml) and diethyl ether (30 ml) were added and the mixture was stirred for an additional 15 minutes. The layers were separated and the aqueous layer was extracted once again with 30 ml diethyl ether. The combined organic phases were washed with a saturated aqueous NaCl solution, dried with $MgSO_4$ and evaporated to remove the ether. 80 ml of ethanol were poured into the flask containing the clear, viscous residue consisting of the product and excess alkyl bromide. The mixture was heated up to boiling under reflux until the two phases have been merged.

The hot solution was cooled down to room temperature slowly revealing the crystallizing product as long, colorless needles. The solution was filtered and the product was washed with 50 ml of cold ethanol to remove any residual alkylbromide. 7.5 g (90 percent yield) of 9,9-di(ethylhexyl) fluorene was isolated and dried under vacuum.

Flight desorption mass spectrometry and proton as well as carbon magnetic resonance spectra were consistent with the title structure.

Polymerization

Reaction scheme

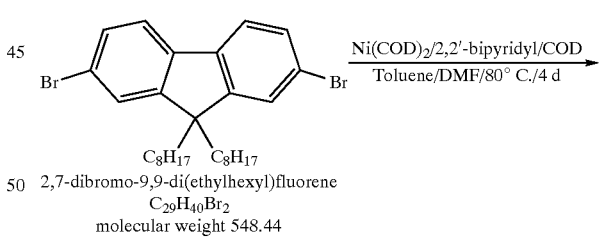

2,7-dibromo-9,9-di(ethylhexyl)fluorene
$C_{29}H_{40}Br_2$
molecular weight 548.44

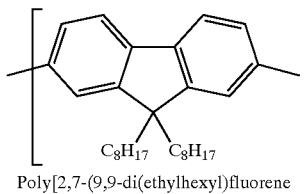

Poly[2,7-(9,9-di(ethylhexyl)fluorene]

Procedure 2.3 g (8.37 mmol, 2.3 equ.) of bis(1,5-cyclooctadiene) nickel(0) ($Ni(COD)_2$), 1.32 g (8.37 mmol, 2.3 equ.) of 2,2'-bipyridyl, 8 ml of dimethylformamide (DMF) and 20 ml of toluene were placed under argon into a thoroughly dried Schlenk tube. The mixture was stirred for 30 minutes at 80° C.

2 g of 2.7-dibromo-9.9-di(ethylhexyl)fluorene (3.64 mmol,1 equ.) dissolved in 12 ml of toluene were added at once using a syringe. After 5 minutes 0.6 ml (4.37 mmol, 1.2 equ.) of 1,5-cyclooctadiene (COD) were added and the reaction mixture was kept stirring under argon for 4 days at 80° C.

50 ml of chloroform were added to the hot reaction mixture and stirred for 15 minutes. This mixture was washed twice with hydrochloric acid (2 N), further 50 ml of chloroform were added and the organic layer was washed with a saturated aqueous solution of $NaHCO_3$ and dried with $MgSO_4$.

This solution was filtered through a short column of silica gel which has been thoroughly dried for 6 hours under vacuum at a temperature of at least 200° C. prior to its use. The solvent has been evaporated until the polymer solution became viscous. The polymer was precipitated from a mixture of 100 ml methanol, 100 ml acetone and 10 ml concentrated hydrochloric acid, filtered and extracted for 3 days with acetone and one day with ethyl acetate. Finally, the polymer was redissolved in 100 ml chloroform, the solvent was partially evaporated and the polymer was precipitated again from the same mixture used for first time precipitation. The yield was 1.1 g (80%).

The emissive layer was prepared by spin-coating this solution at 2300 rpm onto the hole transporting layer. This gave a film thickness of 80 nm. The sample was then dried at 70° C. in vacuum for 12 hours. Calcium was deposited on top by thermal evaporation at $10^{-6}$ mbar, at an evaporation rate of 0.7 nm per second. The final thickness of the calcium top electrode was 15 nm. On top of this Ca layer a 70 nm thick aluminum layer was deposited by thermal evaporation at $10^{-6}$ mbar at a rate of 0.5 nm per second. The final area of the device was 0.06 $cm^2$.

Figure 4:
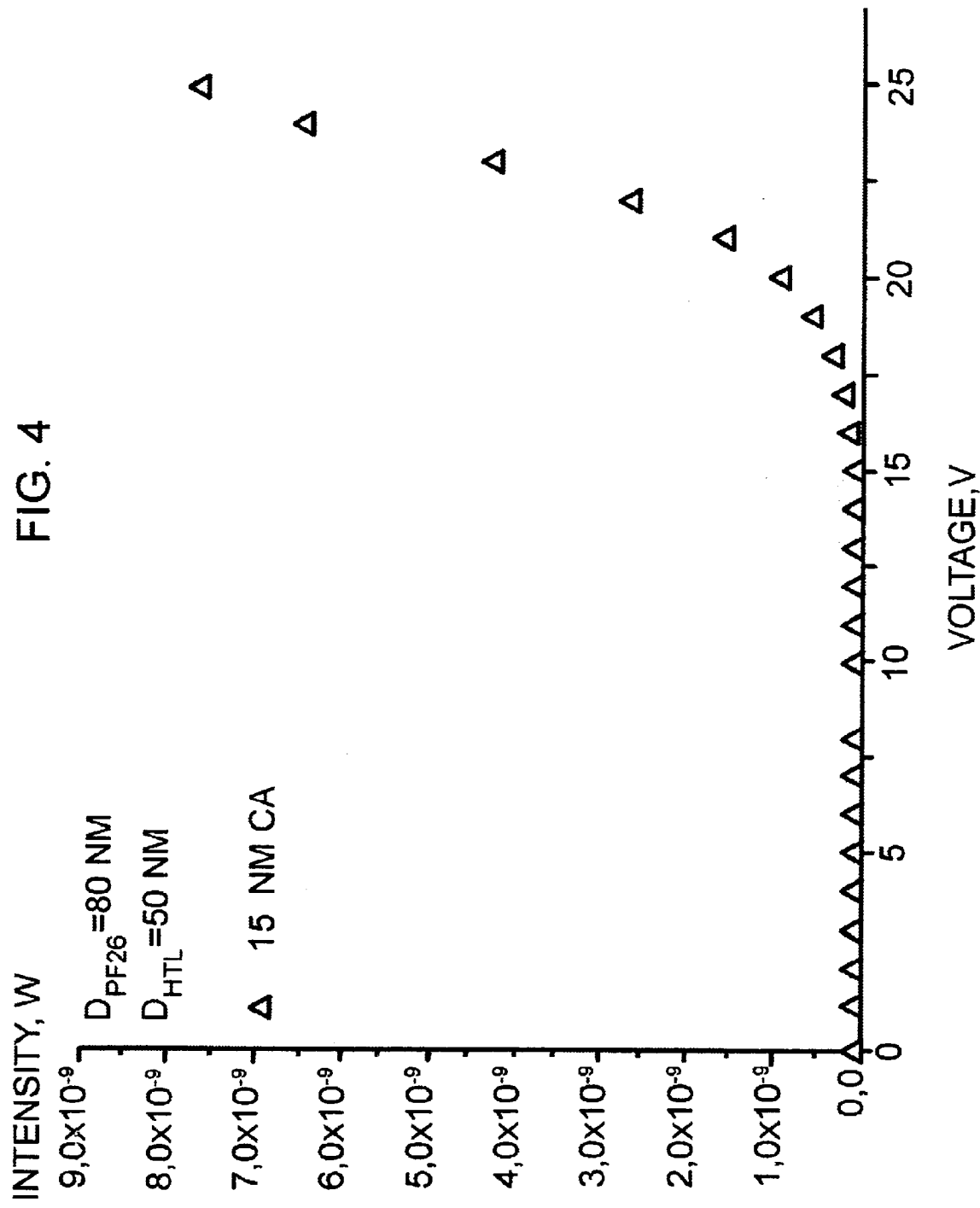
FIG. 4 is a diagram showing the light intensity as a function of voltage for the light emitting diode device described in Example 3.
Figure 5:
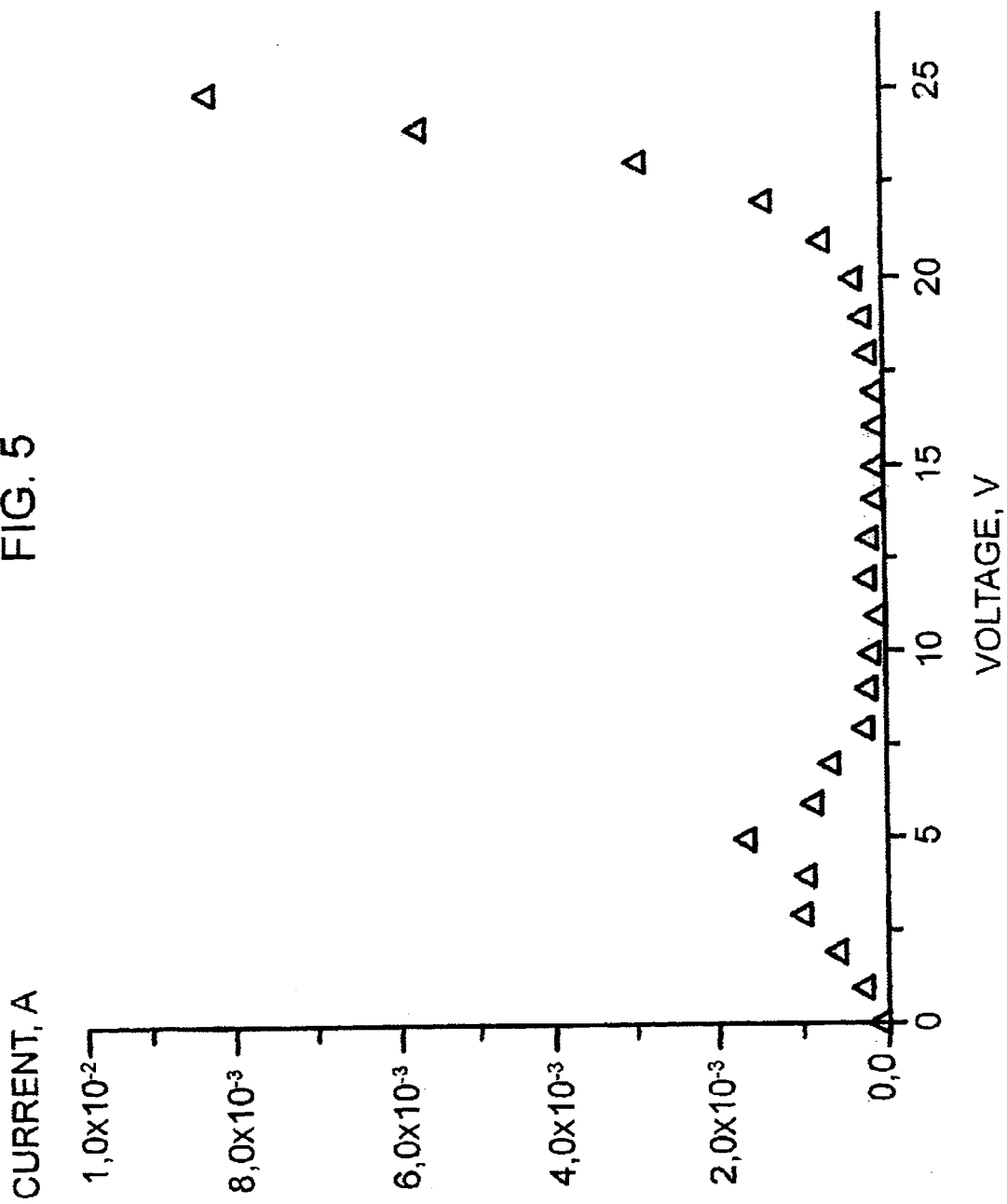
FIG. 5 is a diagram showing the current through the device as a function of the applied voltage for the light emitting diode described in Example 3.

The light intensity emitted by this device and the I-V curve are shown in FIG. 4 and FIG. 5, respectively. The device emitted blue light, which was clearly visible to the human at a voltage larger than 22 V in a well illuminated lab environment. The luminance at 24 V and 8 mA was 10 $cd/m^2$.

Example 4

Light Emitting Diode Comprising Novel Hole Transporting Layer and Polyfluorene as the Emissive Material The device consisted of an ITO coated glass, a hole transporting layer a weight ratio of ST638 of 17/83 to the PI precursor, an emissive layer of poly[2,7-(9,9-diethylhexylfluorene)] and a calcium top electrode protected with a layer of aluminum.

An ITO coated glass was cleaned as described in Example 1. Upon this lass a hole transporting layer as described in Example 1 with a concentration of 17 weight % of hole conductor was applied by spin coating as described in Example 1. Thickness of the layer after conversion to polyimide was 50 nm.

Finally, the hole transporting layers were unidirectionally rubbed using a rubbing machine from E. H. C. Co., Ltd., Japan. The rotating cylinder was covered with a cotton cloth and its rotating speed was 1400 rpm. The samples were passed twice under the cylinder at a translating speed of 2.2 mm/s. The depth of impression of the rubbing cloth onto the substrate was approximately 0.2 mm which means that there was full contact between the cloth and the surface of the substrates.

Poly(2,7-(9,9-di(ethylhexyl)fluorene)) was prepared as in Example 3.

The poly(di-ethylhexyl fluorene) was dissolved in toluene with a concentration of 10 g/l. The solution was heated at a temperature of about 60° C. for 10 min and after that filtered with Millipore Millex-LCR13 0.5 $\mu$m syringe-operated filters. The solution was spin-coated onto the hole transporting alignment layers at 2000 rpm for 50 s and the resulting thickness was about 90 nm.

In order to induce the alignment of the poly(di-ethylhexyl fluorene), the samples were thermally annealed in an autoclave for two hours at a temperature of 185° C. and a pressure of 0.1 bar. The heating and the cooling rate were both 5 K/min. Calcium was deposited on top by thermal evaporation at $10^{-6}$ mbar, at an evaporation rate of 0.7 nm per second. The final thickness of the calcium top electrode was 20 nm. On top of this Ca layer a 100 nm thick aluminum layer was deposited by thermal evaporation at $10^{-6}$ mbar at a rate of 0.5 nm per second. The final area of the device was 0.06 $cm^2$.

Figure 6:
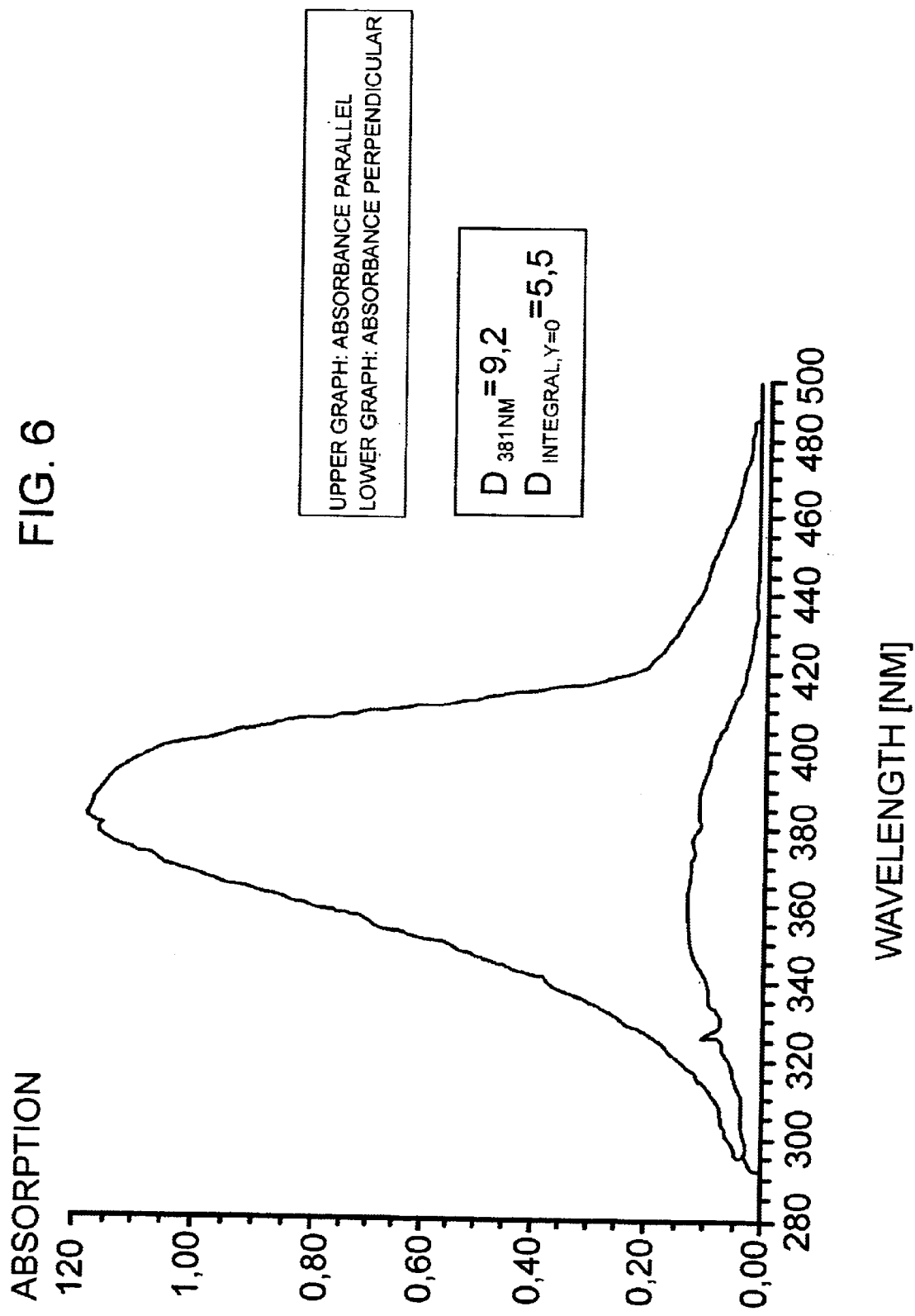
FIG. 6 is a diagram showing the absorbance spectra of poly(di(ethylhexyl))fluorene spin-coated onto rubbed polyimide after annealing, as described in Example 4.

The alignment of the light emitting polymer yielded a dichroic ratio $D_{381}$ nm of 9.2 between the absorbance parallel and perpendicular to the rubbing direction (at the peak wavelength of 381 nm), as can be seen from the absorbance spectra shown in FIG. 6. The integral dichroism $D_{integral}$—the ratio of the areas between the respective curve and the baseline y=0 parallel and perpendicular to the rubbing direction—was in absorbance 5.5.

Figure 7:
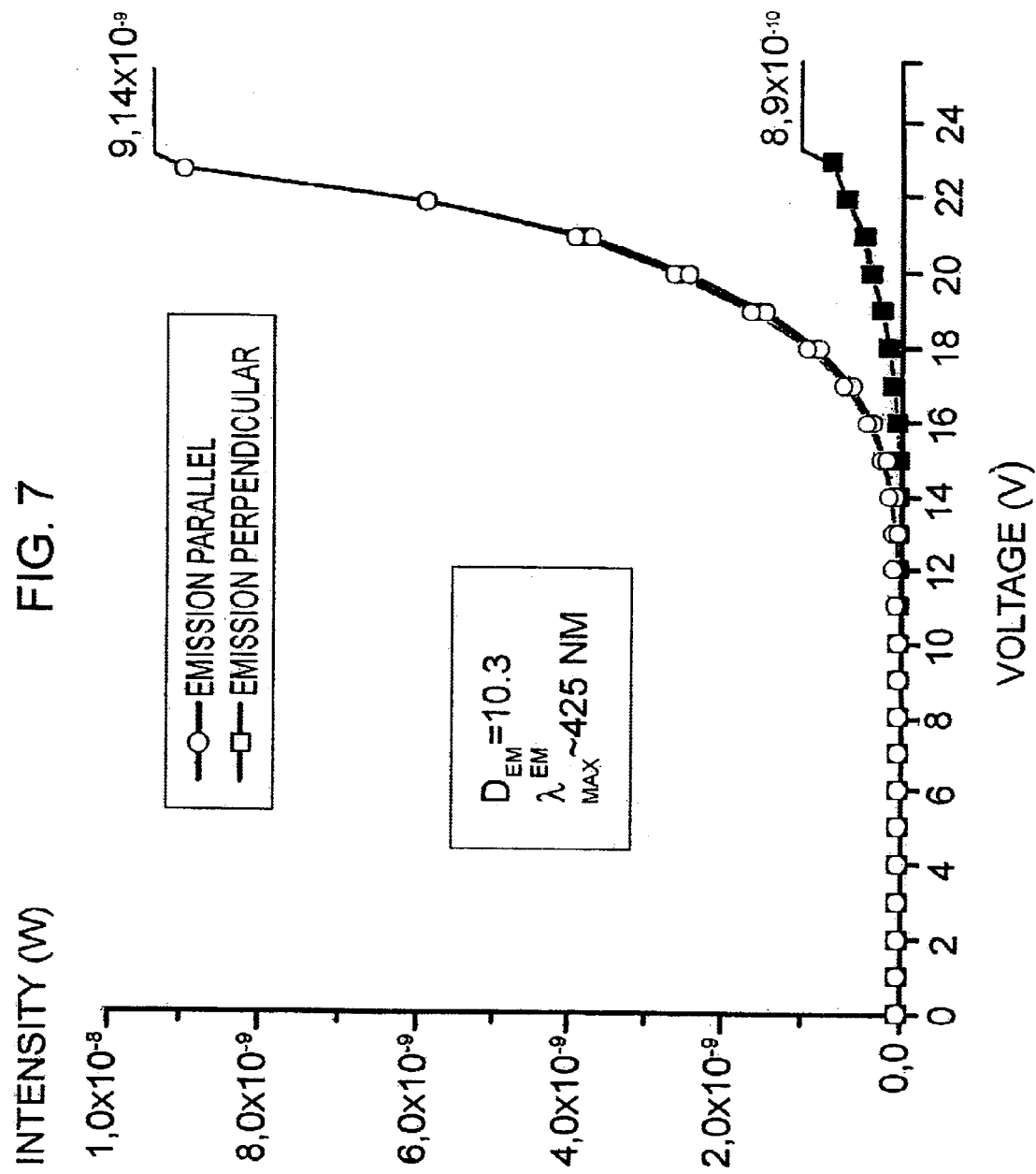
FIG. 7 is a diagram showing the light intensity as a function of voltage for the device described in Example 4.

The intensity as a function of voltage for the light emitted parallel and perpendicular to the rubbing direction for this device is shown in FIG. 7. The device emitted blue light at a wavelength of 425 nm, which was clearly visible to the human eye in a well illuminated lab environment at a voltage larger than 15 V. The luminance at 22 V and 8 mA was 30 $cd/m^2$. The intensity ratio between the light emitted parallel and perpendicular to the rubbing direction was 10.3 at $\lambda$=425 nm.

Example 5

Electroluminescent Device Comprising Multilayers of Hole and Electron Transporting and Emitting Layers An ITO substrate is prepared as described in Examples 2 to 4. Subsequently, a layer comprising hole transport material ST638 and polyimide is prepared in a manner identical to Examples 3 and 4. After conversion of this layer to an insoluble composite of polyimide and hole transport material, a subsequent layer of polyimide precursor and the light emitting material spiro-sexiphenylene as shown in above structural formula VII (cf. Ref. [17]) is deposited under the following conditions: Concentration of emitter material: 30%; spinning speed: 4000 rpm; film thickness: about 15 nm. This layer is converted as the other layer at 300° C. under vacuum to an insoluble, homogenous composite material.

On top of this layer a further composite layer is deposited which contains the same precursor material and 30% by weight of a spiro-linked oxadiazole having the structural formula (VI) shown above (cf. Refs. [13] and [17]) as electron transport material. The spincoating speed is 2000 rpm.

After conversion an insoluble, homogenous composite is obtained with a thickness of ca. 50 nm. On top of this multilayer system the following electrode is deposited: 20 nm Ca, 100 nm Al, as in Examples 3 and 4. A light emitting device is obtained which can show blue emission with a brightness of up to 500 $cd/m^2$ at a voltage of less than 10 V and a current density of less than 50 $mA/cm^2$.

As described above, by making a homogeneously mixed composite of a good aligning material and good hole transport material it is possible to combine the good qualities of both materials. By varying the concentration of hole conductor the mobility can be tuned to the optimal value for the device in question. By doping with different hole conductors the energy levels can be tuned for optimal hole injection. By using dopants with high $T_g$ and relatively high molecular weight the tendency for the two components to phase separate can be counteracted and homogeneously mixed films can be prepared, in contrast to the state of the art. As shown in Example 1, it is possible to obtain space charge limited current over a wide range of concentrations and mobilities in such homogeneously mixed films.

In addition, the homogeneously mixed composite layers described above are resistant after conversion to polyimide to further solvent treatment, thereby allowing the preparation of multilayers by successive coating and conversion cycles. This allows on the one hand the preparation of successive hole injection and conducting layers with small energy barriers to improve hole injection. It also allows on the other hand the preparation of multilayer electroluminescent devices with tunable mobilities and energy levels by solvent based coating processes.

Thus, coating can be performed by spin coating, drop coating, doctor blading, dip coating, slot die coating, curtain coating as well as by ink jet printing and offset printing—allowing a patterned coating—, and other coating techniques known in the art.

The layers thus prepared are, after conversion to polyimide, thermally stable up to well over 100° C. without morphological or chemical changes.

Finally, the layers thus prepared combine all of the above advantages of stability, charge injection and transport, tunability and solvent resistance with a high aligning ability.

REFERENCES

1. N. A. J. M. van Aerle et al., J. Appl. Phys. 74, 3111 (1993)
2. C. Adachi, T. Tsutsui and S. Saito, Optoelectronics 6, 25 (1991)
3. J. Salbeck, Ber. Bunsenges. Phys. Chem. 100, 1667 (1996)
4. G. Gustafsson, Y. Cao, G. M. Treacy, F. Klavetter, N. Colaneri and A. Heeger, Nature 357, 477 (1992)
5. R. Gill, European Materials Research Society meeting, June 1998
6. K. Katsuma and Y. Shirota, Adv. Mat. 10, 223 (1998); C. Giebeler, H. Antoniadis, D. D. C. Bradley and Y. Shirota, Appl. Phys. Lett. 72, 2448 (1998)
7. J. Salbeck, K. Weinfurtner, 220. Heraeus Symposium "Electroluminescence of Organic Materials", 24–28. June
8. M. Thelakkat and H. W. Schmidt, Adv. Mat. 10, 219 (1998)
9. PCT Patent Application WO 96/03015; P. Dyreklev, M. Berggren et al., Adv. Mat. 7, 43 (1995)
10. D. Neher, M. Remmers and V. Cymrova, Adv. Mat. 8, 146 (1996)
11. PCT Patent Application WO 97/07654
12. M. Hamaguchi and K. Yoshino, Appl. Phys. Lett. 67, 3381 (1995)
13. G. Lüissem, F. Geffarth, A. Greiner, W. Heitz, M. Hopmeier, M. Oberski, C. Unterlechner and J. H. Wendorff, Liquid Crystals 21, 903 (1996)
14. M. Era, T. Tsutsui and S. Saito, Appl. Phys. Lett. 67, 2436 (1995)
15. Y. Nishikata, S. Fukui, M. Kakimoto, Y. Imai, K. Nishiyama and M. Fujihara, Thin Solid Films 210/211, 296 (1992)
16. H. Lin, H. Park, J.-G. Lee, Y. Kim, W.-J. Cho and C.-S. Ha, SPIE 3281, 345 (1998)
17. J. Salbeck, in "Inorganic and Organic Electroluminescence", Wissenschaft und Technik Verlag, Berlin (1996)

What is claimed is:

1. A layer for use in electronic and optoelectronic devices, comprising polyimide and one or more organic materials selected from the group consisting of hole transport materials, electron transport materials and emitter materials having a glass transition temperature of more than 80° C. and a molecular weight of greater than 750, wherein said hole transport material is a compound or a mixture of compounds selected from the group consisting of:

a. compounds of formula (1):

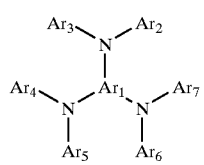

(I)

wherein $Ar_1$ is selected from the group consisting of compounds 1, 2, 3, 4 and 5:

(1)

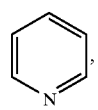

(2)

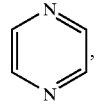

(3)

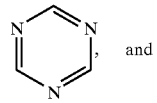

(4)

, and

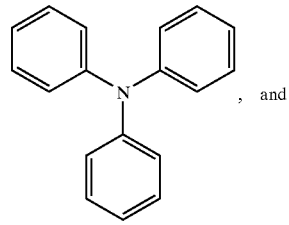

(5)

, and wherein $Ar_2$ to $Ar_7$ are, independently of each other, selected from the group consisting of compounds (a), (b), (c), (d) and (e):

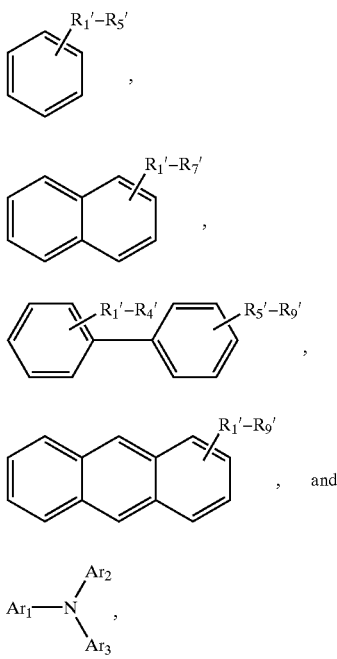

(a), (b), (c), (d), and (e)

wherein $R_1'$ to $R_9'$ are, independently of each other, a hydrogen atom, a $-CH_nH_{2n+1}$ residue, a $-OC_nH_{2n+1}$ residue, wherein n is an integer from 1 to 20, or a group of the formula:

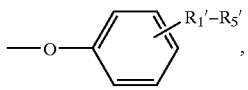

b. compounds of the formula (II):

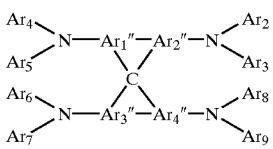

wherein $Ar_1'$ to $Ar_4'$ are, independently of each other, a compound selected from the group consisting of compounds (1) to (5) as above, and wherein $Ar_2$ to $Ar_9$, independently of each other, are compounds selected from the group consisting of compounds (a) to (e) as above; and c. compounds of the formula (III):

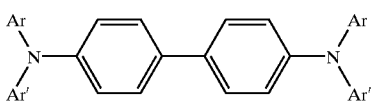

wherein Ar is:

[Structure with $R_{5-8}'$, $R_{9-12}'$, $R_{1-4}'$]

wherein $R_{1'}$ to $R_{12'}$ are, independently of each other, selected from the group consisting of those compounds recited for $R_{1'}$ to $R_{9'}$ above, and wherein Ar is the same as Ar or is a compound selected from the group consisting of those recited for compounds (a) to (e) above, and wherein said layer is adapted to be aligned.

2. The layer according to claim 1, wherein said layer is formed by mixing said hole transport material, electron transport material or emitter material or a combination thereof with a polyimide precursor material into a mixture, forming a thin film from the mixture and heating said film to form doped polyimide.

3. The layer according to claim 2, wherein the content of said hole transport, electron transport or emitter material or of said combination thereof in said mixture is selected in the range of 1% to 60% by weight, based on the total amount of hole transport, electron transport or emitter material and polyimide precursor material.

4. The layer according to claim 1, wherein said hole transport, electron transport or emitter material has a glass transition temperature of higher than 100° C. and a molecular weight of greater than 900.

5. The layer according to claim 1, wherein said layer comprises polyimide and a hole transport material.

6. The layer according to claim 1, wherein said layer comprises polyimide and an electron transport material.

7. The layer according to claim 6, wherein said electron transport material is a spiro-oxadiazole compound.

8. The layer according to claim 1, wherein said layer comprises polyimide and an emitter material.

9. The layer according to claim 8, wherein said emitter material is a spirolinked oligophenylene compound.

10. An electronic or optoelectronic device comprising at least one layer according to claim 1.

11. The electronic or optoelectronic device according to claim 10, wherein said device is an electroluminescent light emitting device and said layer comprises a hole transport material.

12. A device comprising at least one layer according to claim 1 and a liquid crystalline material or a composite comprising a liquid crystalline material, said layer being optionally prepared to give it aligning properties for liquid crystals.

13. The device according to claim 12, wherein said liquid crystalline material comprises a polymeric liquid crystalline material.

14. The device according to claim 13, wherein the polymeric liquid crystalline material comprises a light emitting material.

15. The device according to claim 13, wherein said polymeric liquid crystalline material is an emitter material.

16. An electroluminescent device for emitting polarized light upon application of an electric field, comprising a transparent conductive glass substrate, a layer according to claim 1 formed on said substrate and prepared as an orientation layer, a layer of a polymeric liquid crystalline emitter material coated and aligned on said orientation layer and a metallic cathode deposited on the layer of said polymeric liquid crystalline emitter material.

17. A method of manufacturing a light emitting electroluminescent device, comprising the steps of:

providing a layer according to claim 1 on a substrate;

preparing said layer for alignment with a polymeric liquid crystalline material;

applying said polymeric liquid crystalline material comprising a light emitter material or being itself an emitter material on said layer; and aligning said polymeric liquid crystalline material on said layer.

18. The method according to claim 17, wherein said preparing step utilizes rubbing, UV irradiation or treatment with a flow of air.

19. The method according to claim 17, wherein said polymeric liquid crystalline material is applied onto said layer by spin coating, doctor blading or ink jet printing.

* * * * *